(12) United States Patent
Wu et al.

(10) Patent No.: US 10,090,853 B1
(45) Date of Patent: Oct. 2, 2018

(54) ANALOG-TO-DIGITAL CONVERSION DEVICE

(71) Applicant: Faraday Technology Corp., Hsinchu (TW)

(72) Inventors: Shu-Dong Wu, Suzhou (CN); Feng Xu, Suzhou (CN)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/867,734

(22) Filed: Jan. 11, 2018

(30) Foreign Application Priority Data

Nov. 16, 2017 (CN) .......................... 2017 1 1135477

(51) Int. Cl.
*H03M 1/38* (2006.01)
*H03M 1/14* (2006.01)
*H03M 1/46* (2006.01)
*H03M 1/40* (2006.01)

(52) U.S. Cl.
CPC .............. *H03M 1/38* (2013.01); *H03M 1/144* (2013.01); *H03M 1/40* (2013.01); *H03M 1/403* (2013.01); *H03M 1/46* (2013.01)

(58) Field of Classification Search
CPC .......... H03M 1/38; H03M 1/40; H03M 1/403; H03M 1/46; H03M 1/144; H03M 1/462; H03M 1/466
USPC .......................................... 341/161–163, 172
See application file for complete search history.

(56) References Cited

U.S. PATENT DOCUMENTS

| | | | | |
|---|---|---|---|---|
| 6,154,164 A | * | 11/2000 | Gross, Jr. .............. | H03M 1/462 341/155 |
| 6,154,165 A | * | 11/2000 | Gross, Jr. .............. | H03M 1/462 341/155 |
| 7,432,844 B2 | * | 10/2008 | Mueck ................ | H03M 1/0682 341/161 |
| 8,344,925 B1 | | 1/2013 | Evans | |
| 8,477,058 B2 | * | 7/2013 | Chang ................... | H03M 1/462 341/141 |
| 8,659,464 B2 | * | 2/2014 | Jeon ...................... | H03M 1/462 341/155 |
| 8,766,839 B2 | | 7/2014 | Janakiraman et al. | |
| 8,884,801 B1 | | 11/2014 | Ranjbar | |
| 9,774,339 B2 | * | 9/2017 | Sun ......................... | H03M 1/08 |

* cited by examiner

*Primary Examiner* — Khai M Nguyen
(74) *Attorney, Agent, or Firm* — Winston Hsu

(57) ABSTRACT

An analog-to-digital conversion device is provided for converting an input signal pair to generate an output signal. The analog-to-digital conversion device includes switch groups, capacitors, a comparator, and a controller. The switch groups receive the input signal pair and reference voltages, and selects to output one of the input signal pair and the reference voltages according to a control signal to generate selection voltages respectively. The capacitors receive the selection voltages respectively and generate a first comparison voltage and a second comparison voltage. The comparator compares the first comparison voltage and the second comparison voltage to generate a comparison result signal. The controller sets conversion times for converting bits of the output signal according to the comparison result signal, wherein at least two of the conversion times are different.

9 Claims, 5 Drawing Sheets

ANALOG-TO-DIGITAL CONVERSION DEVICE

CROSS-REFERENCE TO RELATED APPLICATION

This application claims the priority benefit of China application serial no. 201711135477.0, filed on Nov. 16, 2017. The entirety of the above-mentioned patent application is hereby incorporated by reference herein and made a part of this specification.

BACKGROUND OF THE INVENTION

Field of the Invention

The invention relates to an analog-to-digital conversion device and particularly relates to a successive approximation register (SAR) analog-to-digital conversion device.

Description of Related Art

In the conventional analog-to-digital conversion device, the conversion times for generating all the bits of an output signal are the same (one clock cycle). However, for a SAR analog-to-digital conversion device, the conversion time required for generating the most significant bit (MSB) is usually longer than the conversions time required for generating other bits. Therefore, under the condition of fixed conversion times, the conversion time may be insufficient for the most significant bit or too long for the least significant bit (LSB). How to improve the conversion efficiency of the analog-to-digital conversion device without compromising the accuracy of the output signal is an important issue in this field.

SUMMARY OF THE INVENTION

The invention provides an analog-to-digital conversion device that is capable of adjusting the length of a conversion time for generating each bit of an output signal, so as to maintain accuracy of the output signal.

An analog-to-digital conversion device of the invention is configured to convert an input signal pair to generate an output signal. The analog-to-digital conversion device includes a plurality of switch groups, a plurality of capacitors, a comparator, and a controller. The switch groups receive the input signal pair and a plurality of reference voltages and select to output one of the input signal pair and the reference voltages according to a control signal to respectively generate a plurality of selection voltages. The capacitors respectively receive the selection voltages and generate a first comparison voltage and a second comparison voltage. The comparator is coupled to the capacitors and compares the first comparison voltage and the second comparison voltage to generate a comparison result signal. The controller is coupled to the comparator and the switch groups and sets a plurality of conversion times for converting a plurality of bits of the output signal according to the comparison result signal. Not all the conversion times are the same.

In an embodiment of the invention, the conversion time for converting a more significant bit of the output signal is not shorter than the conversion time for converting a less significant bit of the output signal.

In an embodiment of the invention, the controller includes a conversion time control circuit. The conversion time control circuit is coupled to the comparator. The conversion time control circuit receives the comparison result signal to generate a plurality of state signals by counting the number of pulses of the comparison result signal.

In an embodiment of the invention, the conversion time control circuit includes a plurality of trigger groups. Each of the trigger groups includes at least a trigger, wherein the trigger groups are coupled in series with one another and perform a shift operation on a reference logic level according to the comparison result signal to respectively generate the state signals.

In an embodiment of the invention, the number of the triggers in each of the trigger groups is proportional to a length of the corresponding conversion time.

In an embodiment of the invention, the conversion time control circuit includes a counter and a logic operation circuit. The counter is coupled to the comparator and counts the number of pulses of the comparison result signal to generate a counting result. The logic operation circuit is coupled to the counter and performs a logic operation on the counting result to generate the state signals.

In an embodiment of the invention, the switch groups include a plurality of first switch groups and a plurality of second switch groups. The capacitors include a plurality of first capacitors and a plurality of second capacitors. The first capacitors are respectively coupled between the first switch groups and a first input terminal of the comparator, and the second capacitors are respectively coupled between the second switch groups and a second input terminal of the comparator. The first capacitors provide the first comparison voltage at the first input terminal, and the second capacitors provide the second comparison voltage at the second input terminal.

In an embodiment of the invention, each of the first switch groups includes a first switch, a second switch, and a third switch. The first switch has a first terminal coupled to the corresponding first capacitor and a second terminal receiving a first reference voltage. The second switch has a first terminal coupled to the corresponding first capacitor and a second terminal receiving a second reference voltage. The third switch has a first terminal coupled to the corresponding first capacitor and a second terminal receiving a first input signal. Each of the second switch groups includes a fourth switch, a fifth switch, and a sixth switch. The fourth switch has a first terminal coupled to the corresponding second capacitor and a second terminal receiving the first reference voltage. The fifth switch has a first terminal coupled to the corresponding second capacitor and a second terminal receiving the second reference voltage. The sixth switch has a first terminal coupled to the corresponding second capacitor and a second terminal receiving a second input signal. The first switch to the sixth switch are turned on or off according to the control signal, and a voltage value of the first reference voltage and a voltage value of the second reference voltage are different.

In an embodiment of the invention, the analog-to-digital conversion device further includes a seventh switch and an eighth switch. The seventh switch has a first terminal coupled to the first input terminal of the comparator and a second terminal receiving a common voltage. The eighth switch has a first terminal coupled to the second input terminal of the comparator and a second terminal receiving the common voltage. The seventh switch and the eighth switch are turned on or off according to the control signal.

In an embodiment of the invention, the controller respectively generates the bits of the output signal in the conversion times according to the comparison result signal.

Based on the above, the analog-to-digital conversion device according to one or some embodiments of the invention is capable of setting the lengths of the conversion times differently for multiple bits of the output signal, such that all the bits have sufficient conversion times. Thus, the analog-to-digital conversion device may generate the output signal with higher accuracy to improve the performance.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
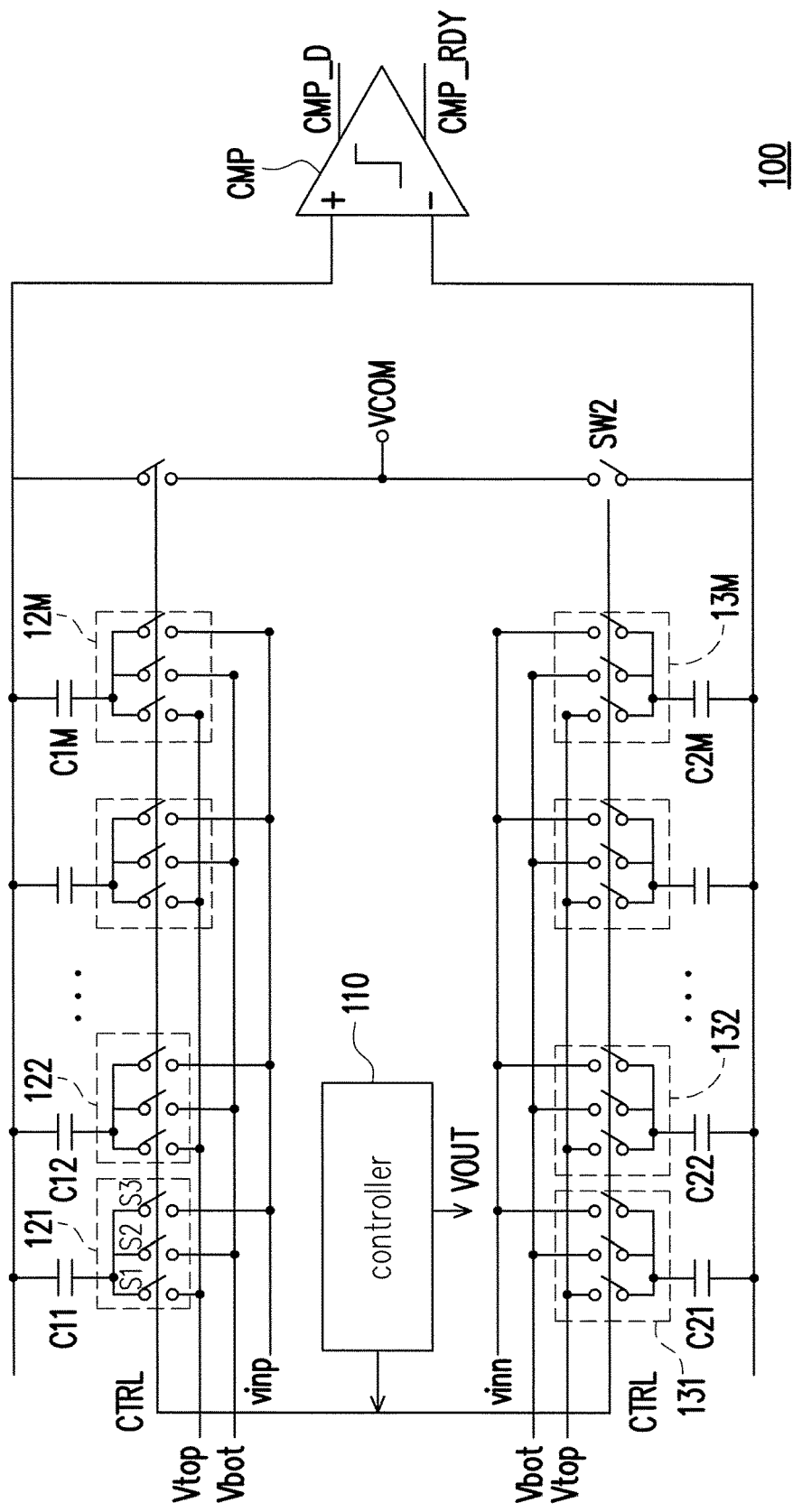
FIG. 1 is a diagram of the analog-to-digital conversion device according to an embodiment of the invention.

Referring to FIG. 1, FIG. 1 is a diagram of an analog-to-digital conversion device according to an embodiment of the invention. The analog-to-digital conversion device 100 includes switch groups 121 to 12M and 131 to 13M, capacitors C11 to C1M and C21 to C2M, a comparator CMP, a controller 110, and switches SW1 and SW2. The switch groups 121 to 12M receive an input signal vinp of an input signal pair and reference voltages Vtop and Vbot. The switch groups 131 to 13M receive an input signal vinn of the input signal pair and the reference voltages Vtop and Vbot, wherein a voltage value of the reference voltage Vtop is greater than a voltage value of the reference voltage Vbot. The switch groups 121 to 12M are coupled to the first terminals of the capacitors C11 to C1M respectively, and the second terminals of the capacitors C11 to C1M are coupled to one another and generate a comparison voltage VC1. The switch groups 131 to 13M are coupled to the first terminals of the capacitors C21 to C2M respectively, and the second terminals of the capacitors C21 to C2M are coupled to one another and generate a comparison voltage VC2. The comparison voltages VC1 and VC2 are provided to a first input terminal (e.g., a positive input terminal) and a second input terminal (e.g., a negative input terminal) of the comparator CMP respectively, and the comparator CMP generates comparison result signals CMP_D and CMP_RDY by comparing the comparison voltages VC1 and VC2.

Each of the switch groups 121 to 12M and the switch groups 131 to 13M includes three switches. Take the switch group 121 as an example, the switch group 121 includes switches S1 to S3, where the first terminals of the switches S1 to S3 respectively receive the reference voltages Vtop and Vbot and the input signal vinp, and the second terminals of the switches S1 to S3 are all coupled to the capacitor C11. The switches S1 to S3 are turned on or off according to a control signal CTRL, and select one of the reference voltages Vtop and Vbot and the input signal vinp as a selection signal and transmit the selection signal to the capacitor C11. At most one of the switches S1 to S3 may be turned on according to the control signal CTRL.

The controller 110 is coupled to the comparator CMP, the switch groups 121 to 12M, and the switch groups 131 to 13M. The controller 110 generates the control signal CTRL and enables the switch groups 121 to 12M and the switch groups 131 to 13M to provide voltages to the corresponding capacitors C11 to C1M and C21 to C2M according to the control signal CTRL. Through the capacitors C11 to C1M and C21 to C2M that have different capacitances, the analog-to-digital conversion device 100 generates the comparison voltages VC1 and VC2 in a SAR manner, and through a comparison operation executed by the comparator CMP, the controller 110 correspondingly generates a plurality of bits of the digital output signal VOUT generated with respect to the analog input signal vinp (or the input signal vinn).

Here, it should be noted that, in the SAR analog-to-digital conversion operation, the bits of the output signal VOUT are generated one by one. The controller 110 may first generate the most significant bit (MSB) of the output signal VOUT and then generate the second most significant bit of the output signal VOUT, and finally generate the least significant bit (LSB) of the output signal VOUT. The point is that the controller 110 may control a conversion time for generating each bit of the output signal VOUT according to the comparison result signal CMP_RDY (or CMP_D) generated by the comparator CMP, and make the conversion time for generating a more significant bit of the output signal VOUT equal to or longer than the conversion time for generating a less significant bit.

In this embodiment, a time T for the analog-to-digital conversion device 100 to complete the analog-to-digital conversion operation and generate all the bits of the output signal VOUT may be represented by the following equation (1):

$$T = t_{sample} + t_{MSB} + t_{MSB-1} + \ldots + t_1 \quad (1)$$

where $t_{sample}$ represents a sampling time of the input signal vinp, and $t_{MSB}, t_{MSB-1}, \ldots,$ and $t_1$ represent the conversion times for generating the bits of the output signal VOUT. If the analog-to-digital conversion device 100 executes a counting operation of the sampling time according to a reference clock signal and the frequency of the reference clock signal is fclk, the equation (1) may be rewritten as the equation (2) shown below:

$$T = \frac{m_s}{fclk} + \frac{m_n}{fclk} + \frac{m_{n-1}}{fclk} \ldots + \frac{m_1}{fclk} \quad (2)$$

wherein $m_s$ represents the number of pulses of the reference clock signal required for the sampling operation of the input signal vinp, and $m_n$ to $m_1$ represent the numbers of pulses of the reference clock signal required for generating multiple bits of the output signal VOUT respectively. The number of pulses $m_n$ corresponds to the most significant bit of the output signal VOUT, and the number of pulses $m_1$ corresponds to the least significant bit of the output signal VOUT.

It can be easily known from the above that, in the embodiment of the invention, the controller 110 controls the numbers of $m_n$ to $m_1$, so as to adjust the conversion times for generating the bits of the output signal VOUT. In the embodiment of the invention, the controller 110 may raise the number of pulses $m_n$ to increase the conversion time for generating the most significant bit of the output signal VOUT and lower the number of pulses $m_1$ to reduce the conversion time for generating the least significant bit of the output signal VOUT.

Figure 2:
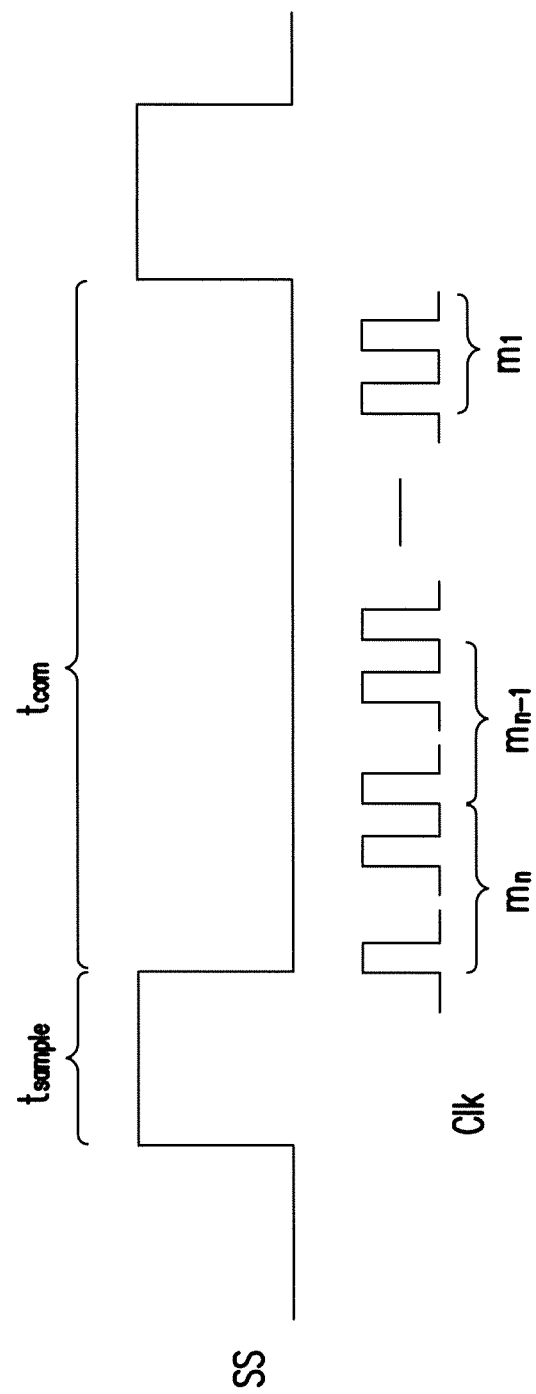
FIG. 2 is an operation waveform diagram of the analog-to-digital conversion device according to the embodiment of the invention.

Referring to FIG. 1 and FIG. 2, FIG. 2 is an operation waveform diagram of the analog-to-digital conversion device according to the embodiment of the invention. The controller 110 of the analog-to-digital conversion device 100 generates a sampling signal SS to control execution of the sampling operation and the conversion operation. When the sampling signal SS is raised up to the time interval $t_{sample}$ at a relatively high voltage level, the analog-to-digital conversion device 100 executes the sampling operation of the input signal vinp. Then, when the sampling signal SS is lowered down to the time interval $t_{con}$ at a relatively low voltage level, the analog-to-digital conversion device 100 executes the conversion operation for sequentially generating multiple bits of the output signal VOUT. By counting the number of pulses of the reference clock signal Clk, the controller 110 may generate a first state signal in the first $m_n$ pulses of the reference clock signal Clk to control the conversion time of the most significant bit of the output signal VOUT; generate a second state signal in the $m_{n-1}$ pulses after the $m_n$ pulses of the reference clock signal Clk to control the conversion time of the second most significant bit of the output signal VOUT; and generate a state signal in the last $m_1$ pulses of the reference clock signal Clk in the time interval $t_{con}$ to control the conversion time of the least significant bit of the output signal VOUT.

It should be mentioned that the analog-to-digital conversion device 100 further includes the switches SW1 and SW2. The first terminal of the switch SW1 is coupled to the first input terminal of the comparator CMP and the second terminal of the switch SW1 receives a common voltage VCOM. The first terminal of the switch SW2 is coupled to the second input terminal of the comparator CMP and the second terminal of the switch SW2 receives the common voltage VCOM. The switches SW1 and SW2 are for initializing the voltage values of the comparison voltages VC1 and VC2. Before the conversion operation of the input signal vinp is performed, the switches SW1 and SW2 may be turned on at the same time according to the control signal CTRL, and the comparison voltages VC1 and VC2 may be set equal to the common voltage VCOM at the same time. When the conversion operation of the input signal vinp starts, the switches SW1 and SW2 may be turned off at the same time according to the control signal CTRL.

It is worth mentioning that, in the embodiment of the invention, the reference clock signal may be the comparison result signal CMP_RDY (or CMP_D) generated by the comparator CMP. In addition, the numbers of pulses $m_n$ to $m_1$ may be obtained through calculation in advance in an analog manner at a design time of the analog-to-digital conversion device 100, and the operation of controlling the conversion time corresponding to each bit according to the numbers of pulses $m_n$ to $m_1$ may be achieved by a hardware circuit. Details of the control operation of the conversion time described above are specified hereinafter.

Figure 3:
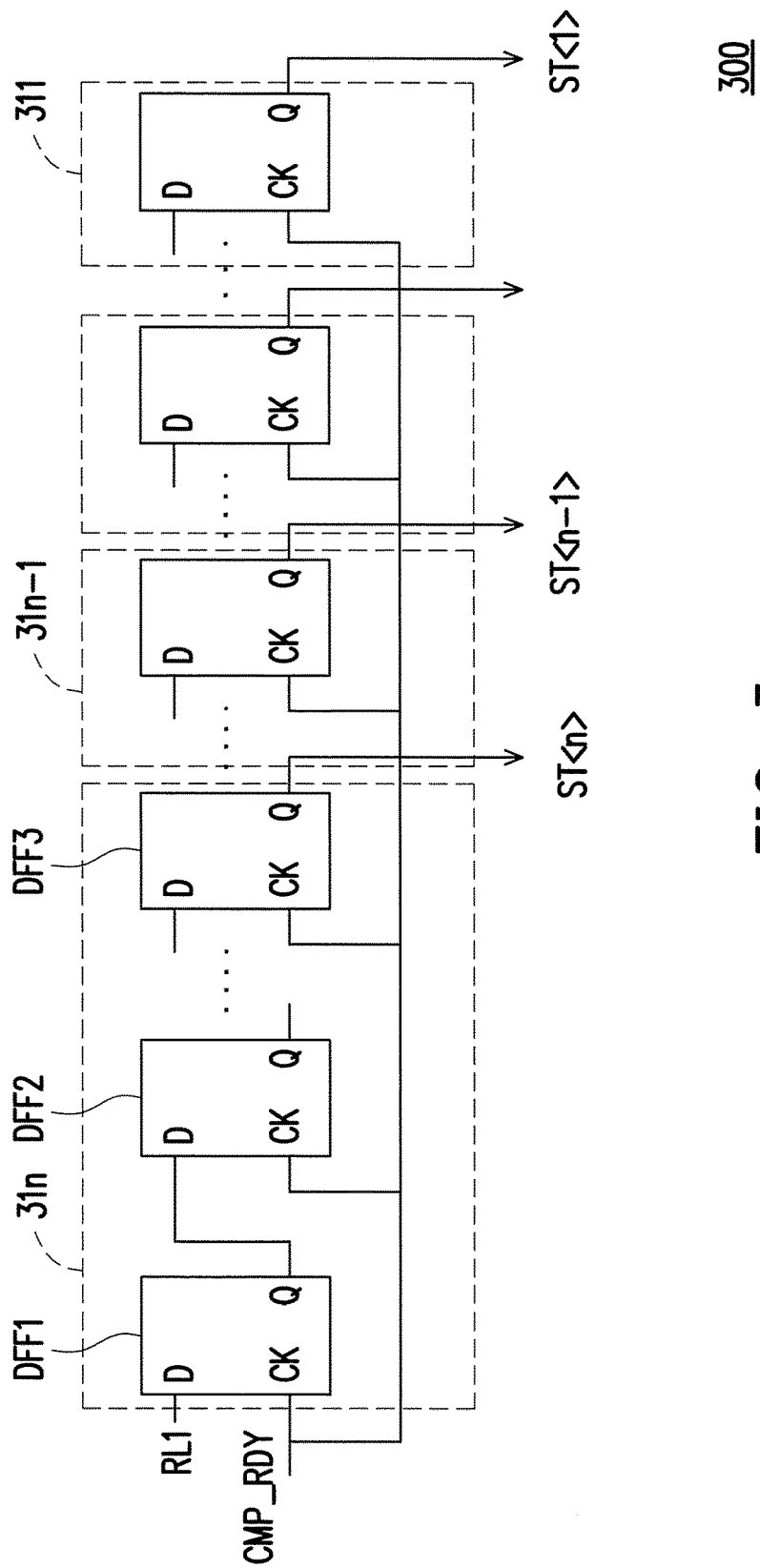
FIG. 3 is a diagram of the conversion time control circuit according to the embodiment of the invention.

Referring to FIG. 3, FIG. 3 is a diagram of a conversion time control circuit according to the embodiment of the invention. A conversion time control circuit 300 may be disposed in the controller 110 of the embodiment of FIG. 1. The conversion time control circuit 300 is coupled to the comparator CMP to receive the comparison result signal CMP_RDY and generate a plurality of state signals ST<1> to ST<n> by counting the number of pulses of the comparison result signal CMP_RDY. The state signals ST<1> to ST<n> respectively correspond to the conversion times for generating multiples bits of the output signal.

The conversion time control circuit 300 includes trigger groups 311 to 31n. The trigger groups 311 to 31n are sequentially coupled in series. Each of the trigger groups includes one or more triggers. In FIG. 3, take the trigger group 31n as an example, the trigger group 31n includes triggers DFF1 to DFF3. The triggers DFF1 to DFF3 are sequentially coupled in series, wherein a data terminal D of the trigger DFF1 receives a reference logic level RL1, an output terminal Q of the trigger DFF1 is coupled to a data terminal D of the trigger DFF2, and an output terminal Q of the trigger DFF2 is coupled to the data terminal of the next trigger. Moreover, the frequency terminals CK of the triggers DFF1 to DFF3 all receive the comparison result signal CMP_RDY. The output terminal of the last trigger DFF3 outputs the state signal ST<n>.

The triggers DFF1 to DFF3 form a shift register circuit and perform a shift operation on the reference logic level RL1 according to the comparison result signal CMP_RDY. When the conversion operation of the most significant bit of the output signal starts, the shift operation of the triggers DFF1 to DFF3 starts. When the reference logic level RL1 is shifted to the last trigger DFF3 to generate the state signal ST<n>, it means that the conversion operation for converting the most significant bit of the output signal is completed. Therefore, the conversion time for converting the most significant bit of the output signal is equal to a product of the cycle of the comparison result signal CMP_RDY and the number of the triggers DFF1 to DFF3.

Accordingly, it is known that the conversion time for converting the second most significant bit of the output signal may be controlled according to the state signal ST<n−1>, and the conversion time for converting the least significant bit of the output signal may be controlled according to the state signal ST<1>.

In this embodiment, the reference logic level RL1 may be a logic level 1 or a logic level 0, and is not particularly limited.

Figure 4:
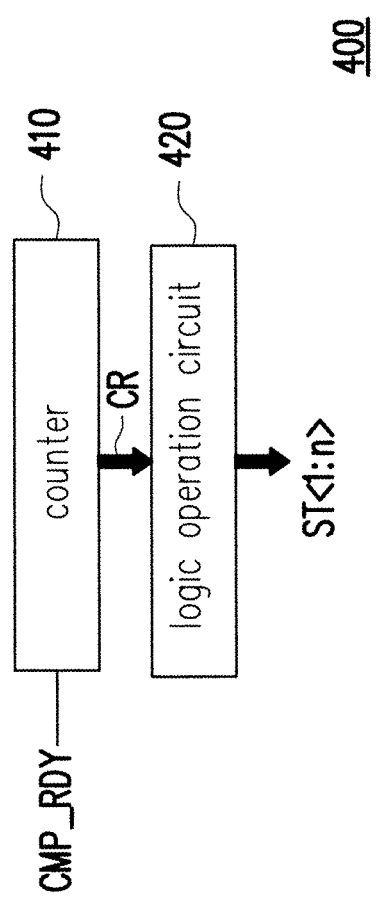
FIG. 4 is a diagram of the conversion time control circuit according to another embodiment of the invention.

Referring to FIG. 4, FIG. 4 is a diagram of a conversion time control circuit according to another embodiment of the invention. A conversion time control circuit 400 includes a counter 410 and a logic operation circuit 420. The counter 410 is coupled to the comparator of the analog-to-digital conversion device and receives the comparison result signal CMP_RDY. When the conversion operation of the output signal starts, the counter 410 generates a counting result CR by counting the number of pulses of the comparison result signal CMP_RDY. The logic operation circuit 420 is coupled to the counter 410 to receive the counting result CR. The logic operation circuit 420 performs a logic operation on the counting result CR, so as to generate state signals ST<1:n>. The state signals ST<1:n> respectively instruct to perform the conversion times of multiple bits of the output signal.

Figure 5:
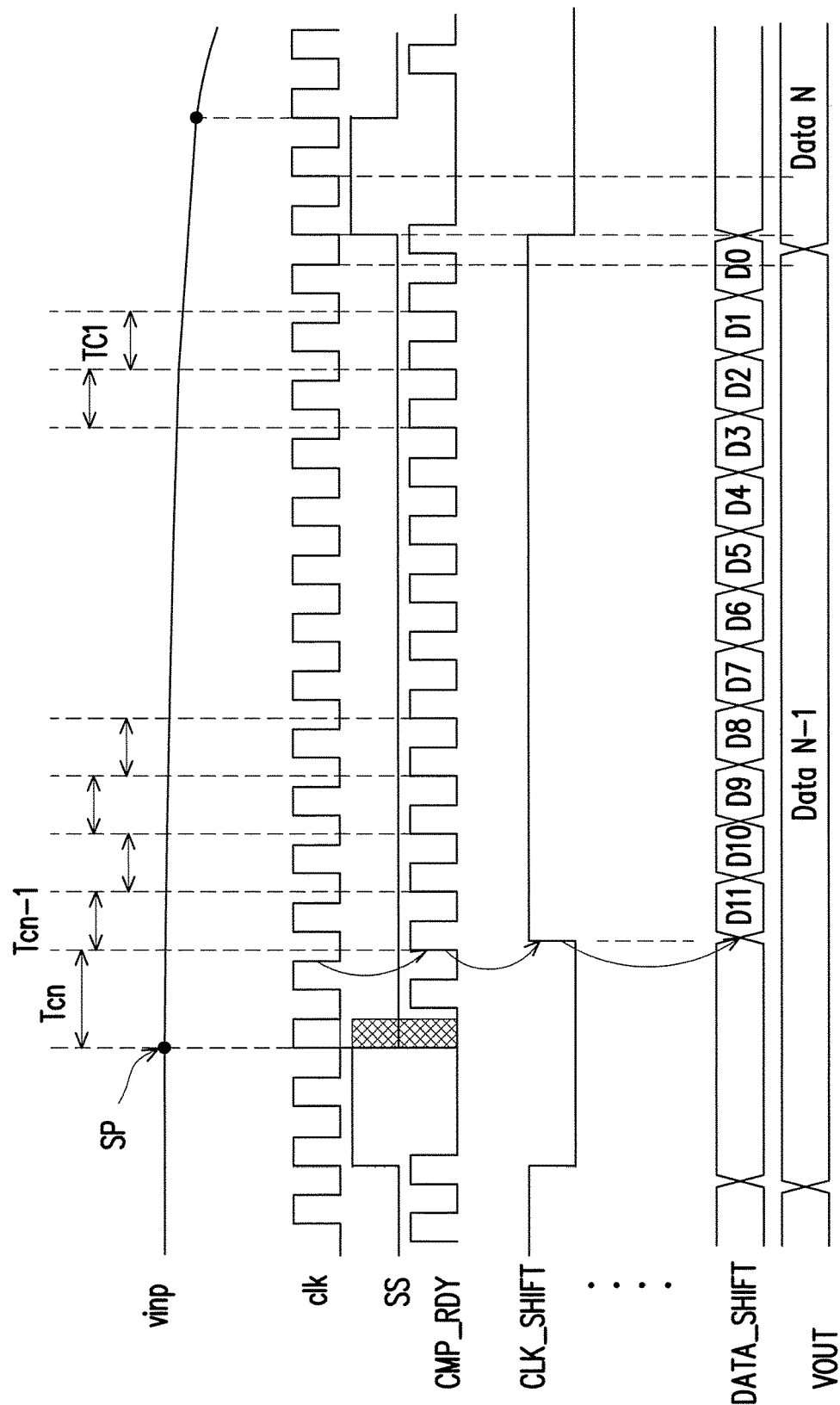
FIG. 5 is a waveform diagram of the analog-to-digital conversion operation of the analog-to-digital conversion device according to the embodiment of the invention.

Hereinafter, referring to FIG. 5, FIG. 5 is a waveform diagram of an analog-to-digital conversion operation of the analog-to-digital conversion device according to the embodiment of the invention. Based on the reference clock signal Clk, the analog-to-digital conversion device performs the sampling operation on the input signal vinp according to the sampling signal SS, and completes the sampling operation on the input signal vinp at the time point of a sampling point SP. In addition, at the time point of the sampling point SP of completing the sampling operation on the input signal vinp, the analog-to-digital conversion device performs the conversion operation of the most significant bit of the output signal VOUT. By counting the number of pulses of the comparison result signal CMP_RDY after the sampling point SP, a conversion time TCn of the most significant bit from the sampling point SP to the second rising edge of the comparison result signal CMP_RDY after the sampling point SP is obtained. Then, a conversion time TCn−1 of the second most significant bit may be obtained from the time point where the conversion time TCn ends to the next rising edge of the comparison result signal CMP_RDY. Accordingly, the conversion times TCn to TC1 corresponding to all the bits of the output signal VOUT may be obtained through calculation.

In addition, the controller of the analog-to-digital conversion device may further generate a plurality of shift signals CLK_SHIFT according to the conversion times TCn to TC1, and generate shift data signals DATA_SHIFT bit by bit according to the shift signals CLK_SHIFT. The shift data signals DATA_SHIFT sequentially generate a plurality of bits D11 to D0 of the output signal VOUT according to the shift signals CLK_SHIFT, and after the least bit D0 of the output signal VOUT is generated, a new output signal VOUT=Data N may be obtained to replace the original output signal VOUT (=Data N−1).

In conclusion, according to the invention, the length of the conversion time corresponding to each bit for performing the conversion operation of the output signal is adjusted, such that the bits that require a longer conversion time have sufficient time to complete the conversion operation and the conversion time for the bits that do not require a longer conversion time may be reduced. Accordingly, the accuracy of the output signal generated by the analog-to-digital conversion device is maintained without compromising the conversion efficiency of the analog-to-digital conversion device, so as to improve the working performance of the analog-to-digital conversion device.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. An analog-to-digital conversion device, converting an input signal pair to generate an output signal, the analog-to-digital conversion device comprising:
   a plurality of switch groups receiving the input signal pair and a plurality of reference voltages and selecting to output one of the input signal pair and the reference voltages according to a control signal to respectively generate a plurality of selection voltages;
   a plurality of capacitors respectively receiving the selection voltages and generating a first comparison voltage and a second comparison voltage;
   a comparator coupled to the capacitors and comparing the first comparison voltage and the second comparison voltage to generate a comparison result signal; and
   a controller coupled to the comparator and the switch groups and setting a plurality of conversion times for converting a plurality of bits of the output signal according to the comparison result signal,
   wherein at least two of the conversion times are different,
   wherein the conversion time for converting a more significant bit of the output signal is not shorter than the conversion time for converting a less significant bit of the output signal.

2. The analog-to-digital conversion device according to claim 1, wherein the controller comprises:
   a conversion time control circuit coupled to the comparator and receiving the comparison result signal to generate a plurality of state signals by counting the number of pulses of the comparison result signal,
   wherein the state signals respectively correspond to the conversion times.

3. The analog-to-digital conversion device according to claim 2, wherein the conversion time control circuit comprises:
   a plurality of trigger groups, each of which comprises at least a trigger, wherein the trigger groups are coupled in series with one another and perform a shift operation on a reference logic level according to the comparison result signal to respectively generate the state signals.

4. The analog-to-digital conversion device according to claim 3, wherein the number of the triggers in each of the trigger groups is proportional to a length of the corresponding conversion time.

5. The analog-to-digital conversion device according to claim 1, wherein the conversion time control circuit comprises:
   a counter coupled to the comparator and counting the number of pulses of the comparison result signal to generate a counting result; and
   a logic operation circuit coupled to the counter and performing a logic operation on the counting result to generate the state signals.

6. The analog-to-digital conversion device according to claim 1, wherein the switch groups comprise a plurality of first switch groups and a plurality of second switch groups, the capacitors comprise a plurality of first capacitors and a plurality of second capacitors, the first capacitors are respectively coupled between the first switch groups and a first input terminal of the comparator, and the second capacitors are respectively coupled between the second switch groups and a second input terminal of the comparator,
   wherein the first capacitors provide the first comparison voltage at the first input terminal, and the second capacitors provide the second comparison voltage at the second input terminal.

7. The analog-to-digital conversion device according to claim 6, wherein each of the first switch groups comprises:
   a first switch having a first terminal coupled to the corresponding first capacitor and a second terminal receiving a first reference voltage;
   a second switch having a first terminal coupled to the corresponding first capacitor and a second terminal receiving a second reference voltage; and
   a third switch having a first terminal coupled to the corresponding first capacitor and a second terminal receiving a first input signal;
   each of the second switch groups comprises:
   a fourth switch having a first terminal coupled to the corresponding second capacitor and a second terminal receiving the first reference voltage;
   a fifth switch having a first terminal coupled to the corresponding second capacitor and a second terminal receiving the second reference voltage; and
   a sixth switch having a first terminal coupled to the corresponding second capacitor and a second terminal receiving a second input signal, wherein the first switch to the sixth switch are turned on or off according to the control signal, and a voltage value of the first reference voltage and a voltage value of the second reference voltage are different.

8. The analog-to-digital conversion device according to claim 1, further comprising:
a seventh switch having a first terminal coupled to the first input terminal of the comparator and a second terminal receiving a common voltage; and
an eighth switch having a first terminal coupled to the second input terminal of the comparator and a second terminal receiving the common voltage,
wherein the seventh switch and the eighth switch are turned on or off according to the control signal.

9. The analog-to-digital conversion device according to claim 1, wherein the controller respectively generates the bits of the output signal in the conversion times according to the comparison result signal.

* * * * *